United States Patent
Ma et al.

(10) Patent No.: US 10,260,957 B2
(45) Date of Patent: Apr. 16, 2019

(54) TIME DOMAIN INTEGRATED TEMPERATURE SENSOR

(71) Applicants: Excelio Technology (Shenzhen) Co.,Ltd., Shenzhen (CN); Wuxi Excelio Technology CO., Ltd., Wuxi (CN)

(72) Inventors: Bill Ma, Shenzhen (CN); Patrick Bian Wu, Shenzhen (CN); Fuqiang Han, Shenzhen (CN)

(73) Assignees: EXCELIO TECHNOLOGY (SHENZHEN) CO., LTD., Shenzhen (CN); WUXI EXCELIO TECHNOLOGY CO., LTD., Wuxi (CN)

( * ) Notice: Subject to any disclaimer, the term of this patent is extended or adjusted under 35 U.S.C. 154(b) by 190 days.

(21) Appl. No.: 15/277,033

(22) Filed: Sep. 27, 2016

(65) Prior Publication Data

US 2017/0016776 A1 Jan. 19, 2017

Related U.S. Application Data

(63) Continuation of application No. PCT/CN2015/074096, filed on Mar. 12, 2015.

(30) Foreign Application Priority Data

Mar. 27, 2014 (CN) .......................... 2014 1 0118216

(51) Int. Cl.
G01K 3/04 (2006.01)
G01K 7/01 (2006.01)
(Continued)

(52) U.S. Cl.
CPC ................. G01K 3/04 (2013.01); G01K 7/01 (2013.01); G05F 1/463 (2013.01); H03K 5/153 (2013.01);
(Continued)

(58) Field of Classification Search
CPC . G01K 3/04; G01K 7/01; G05F 1/463; H03K 5/153; H03K 17/687; H03K 19/21; H03K 21/026; H03K 2005/00019
See application file for complete search history.

(56) References Cited

U.S. PATENT DOCUMENTS

6,052,035 A * 4/2000 Nolan .................... H03K 3/011
331/111
2007/0160113 A1* 7/2007 Kim ......................... G01K 7/01
374/178
(Continued)

Primary Examiner — Jonathan Dunlap
Assistant Examiner — Philip Cotey
(74) Attorney, Agent, or Firm — Wayne & Ken, LLC; Tony Hom (57) ABSTRACT

A time domain integrated temperature sensor described by the present invention adopts a shaped clock signal to control the charging time of capacitors, so that the capacitors generate charging time delay signals related to the cycle of an input clock, and a pulse signal related to pulse width, temperature and the cycle of the input clock is generated through logical XOR (Exclusive OR) operation on a time delay signal generated when the capacitors are charged by one way of PTAT (Proportional To Absolute Temperature) current in an above control manner and a time delay signal generated when the capacitors are charged by one way of CTAT (Complementary To Absolute Temperature) current in the same manner; then, the same input clock signal is adopted for quantifying the pulse width of the pulse signal, the relevance of the obtained quantization result and the cycle of the input clock is completely offset, namely, an output value of the temperature sensor is unrelated to the input clock signal, thereby solving the problem that the reading of the existing time domain integrated temperature sensor is inconsistent as the cycle of the clock signal changes and improving the precision of the time domain integrated temperature sensor to a certain degree.

5 Claims, 7 Drawing Sheets (51) Int. Cl.
  *G05F 1/46*    (2006.01)
  *H03K 5/153*   (2006.01)
  *H03K 17/687*  (2006.01)
  *H03K 19/21*   (2006.01)
  *H03K 21/02*   (2006.01)
  *H03K 5/00*    (2006.01)

(52) U.S. Cl.
  CPC ........... *H03K 17/687* (2013.01); *H03K 19/21* (2013.01); *H03K 21/026* (2013.01); *H03K 2005/00019* (2013.01)

(56) References Cited

U.S. PATENT DOCUMENTS

| | | | | |
|---|---|---|---|---|
| 2007/0241833 | A1* | 10/2007 | Nervegna | H03K 3/011 331/176 |
| 2007/0252573 | A1* | 11/2007 | Tachibana | G05F 3/30 323/313 |
| 2011/0001546 | A1* | 1/2011 | Guo | G01K 3/005 327/512 |
| 2011/0102058 | A1* | 5/2011 | Conte | G05F 3/30 327/512 |
| 2011/0291807 | A1* | 12/2011 | Law | G01K 7/01 340/10.1 |

* cited by examiner

TIME DOMAIN INTEGRATED TEMPERATURE SENSOR

CROSS-REFERENCE TO RELATED APPLICATIONS

This application is a continuation of International Patent Application No. PCT/CN2015/074096 with a filing date of Mar. 12, 2015, designating the United States, now pending, and further claims priority to Chinese Patent Application No. 201410118216.8 with a filing date of Mar. 27, 2014. The content of the aforementioned applications, including any intervening amendments thereto, are incorporated herein by reference.

TECHNICAL FIELD

The present invention relates to the technical field of temperature sensors, in particular to an integrated temperature sensor that carries out signal processing on a temperature value measured by the temperature sensor in a time domain.

BACKGROUND

At present, in the fields of medical monitoring, household appliances, consumer electronics, Internet of Things, intelligent sensing, automotive electronics, intelligent control and so on, the demand for integrated intelligent temperature sensors grows constantly, and the demand for the precision of the integrated intelligent temperature sensors becomes stricter. Domestic and overseas research institutions and enterprises get some research achievements in the aspect of the integrated intelligent temperature sensors, such as *An All-Digital Smart Temperature Sensor with Auto-Calibration in 65 nm CMOS Technology* published by Ching-Che Chung et al. in *IEEE Proceedings of* 2010 *International Symposium on Circuits and Systems, All-Digital Time-Domain Smart Temperature Sensor With an Inter-Batch Inaccuracy of −0.7 DEG C.-+0.6 DEG C. After One-Point Calibration* published by Poki Chen et al. in *IEEE Transactions on Circuits and Systems, An Ultra Low Power 1V, 220 nW Temperature Sensor for Passive Wireless Applications* published by Yu-Shiang Lin et al. in *IEEE Custom Integrated Circuit Conference* and a patent for an invention entitled Low-Voltage and Low-Power CMOS Temperature Sensor with application NO. CN102338669A, applied by Hong Kong University of Science and Technology on Feb. 1, 2012.

Figure 1:
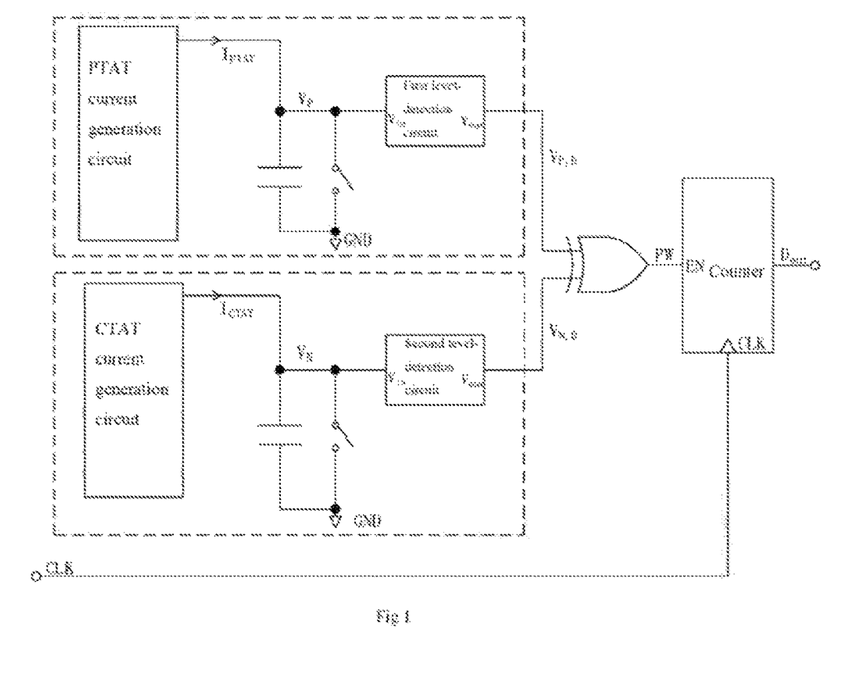
FIG. 1 shows a structure diagram of a temperature sensor circuit in the existing art.

The above four intelligent temperature sensor technologies belong to an integrated temperature sensor circuit technology that is universally adopted in the industry for carrying out signal processing in the time domain. The types of integrated temperature sensors implemented on a semiconductor chip have common characteristics: first, a temperature acquisition and signal conversion element is adopted for converting measured temperature information into a time domain pulse signal related to pulse width and temperature, then a TDC (Time-Digital-Converter) is adopted for converting the time domain pulse signal into a multi-bit digital code stream output, and finally, a temperature reading is obtained according to the corresponding relation between the multi-bit digital code stream output and the temperature. FIG. 1 shows a basic structure of an existing time domain temperature sensor circuit, which comprises a PTAT (Proportional To Absolute Temperature) current generation circuit, a CTAT (Complementary To Absolute Temperature) current generation circuit, a first level-detection circuit, a second level-detection circuit, an XOR (Exclusive OR) gate and a counter, wherein the current output by the PTAT current generation circuit and the temperature are in direct proportion, and the current output by the CTAT current generation circuit and the temperature are in inverse proportion. The PTAT current generation circuit and the CTAT current generation circuit are respectively used for generating a current signal $I_{PTAT}$ in direct proportion with temperature and a current signal $I_{CTAT}$ in inverse proportion with temperature, and the current signal $I_{PTAT}$ and the current signal $I_{CTAT}$ are respectively used for charging for a first capacitor and a second capacitor. When the voltage of the positive end of the first capacitor reaches a threshold voltage of the first level-detection circuit, an output signal $V_{P,D}$ of the first level-detection circuit is overturned; when the voltage of the positive end of the second capacitor reaches a threshold voltage of the first level-detection circuit, an output signal $V_{N,D}$ of the second level-detection circuit is overturned. The output signal $V_{P,D}$ of the first level-detection circuit and the output signal $V_{N,D}$ of the second level-detection circuit are connected to two input ends of the XOR gate, and after XOR processing, a pulse signal PW in linear correlation to the pulse width and temperature is output. The pulse signal PW is connected to an enable end EN of the counter, the counter adopts a system clock CLK to carry out time domain sampling on the pulse width of the signal PW and convert the signal into a discrete digital pulse square wave signal in the time domain, and the temperature reading is obtained by the counting result for the discrete digital pulse square wave signal according to a known comparison relation.

The implementation manner has apparent deficiency in a system with insufficient frequency precision of a clock signal, namely, the change of the frequency of the clock signal, which is also called the change of cycle, can lead to the change of a quantization result of the pulse width in the time domain, so as to cause the reading error and the reading inconsistency of the temperature sensor. For example, in the application field of a passive RFID (Radio Frequency Identification) tag, a clock signal adopted by the temperature sensor integrated in a chip of the RFID tag is a carrier signal sent through an antenna at a transmitting terminal by a card reader and is extracted from received radio-frequency field energy by a clock recovery unit of the chip of the RFID tag, and therefore the temperature reading obtained from the counting of the clock signal is related to the carrier frequency sent by the card reader. According to the relevant norms and international standards of the field, the carrier frequency sent by the card reader is not a strictly precise frequency, but any frequency within the relatively wider frequency scope, and therefore the temperature readings of the temperature sensor in the same RFID tag read by different card readers have considerable difference and are apparently inconsistent. Even though output frequency indexes are same, the cycle of the clock signal extracted by the clock recovery circuit changes significantly with the change of circuit parameters, working environment and manufacturing process. And therefore the time domain temperature sensor implemented by the manner has lower precision, particularly for clock signals from different card readers, the reading consistency is very poor, thereby seriously limiting the application scope of the time domain temperature sensor.

Figure 2:
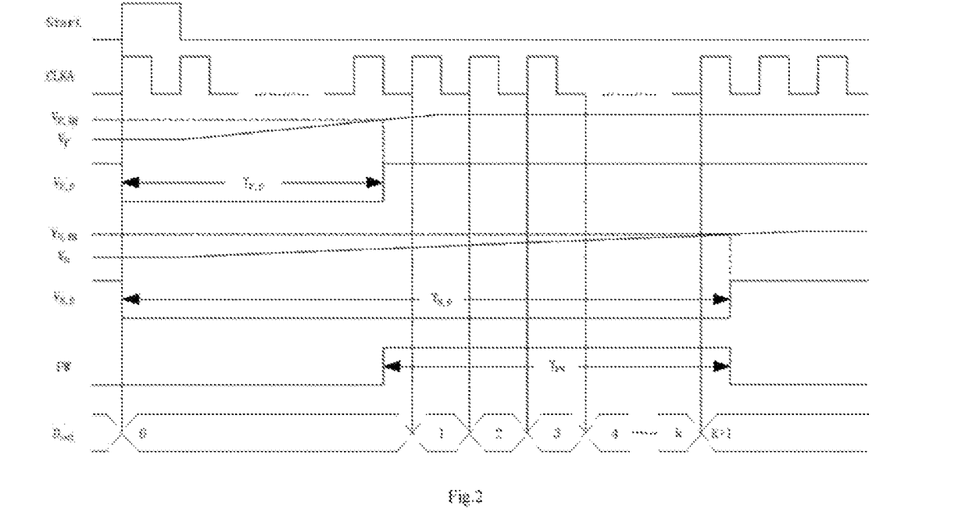
FIG. 2 shows a working principle diagram I of a temperature sensor in the existing art.

For example, for a temperature sensor disclosed by a patent entitled Low-Voltage and Low-Power CMOS Temperature Sensor with application NO. CN102338669A, the working principle of the temperature sensor is shown in FIG. 1 and FIG. 2, wherein after the first capacitor is charged for a period of time $T_{P,D}$, the voltage $V_P$ of the positive end of the first capacitor increases to a threshold voltage $V_{P,TH}$, and a time delay signal $V_{P,D}$ with time delay $T_{P,D}$ is generated by the first level-detection circuit through the voltage $V_P$; while after the second capacitor is charged for a period of time $T_{N,D}$, the voltage $V_N$ of the positive end of the second capacitor increases to a threshold voltage $V_{N,TH}$, and a time delay signal $V_{N,D}$ $T_{N,D}$ are generated by the second level-detection circuit through the voltage $V_N$. The time delay signals $V_{P,D}$ and $V_{N,D}$ are respectively input into two input ends of an XOR logical gate, and the pulse signal PW in linear correlation with the pulse width and temperature is obtained through XOR logical operation. The pulse signal PW is output into an enable input end of a counter, so that the counter can count through taking the system clock CLK as the clock during high voltage-level $T_{PW}$ (pulse width of PW) of the pulse signal PW. When the counting result is K (K is an integer greater than or equal to 0), the pulse width of the pulse signal PW has K clock cycle(s), and then the temperature reading measured by the temperature sensor is obtained according to the preset corresponding relation between the quantization result K of the pulse width of the pulse signal PW and the temperature.

Figure 3:
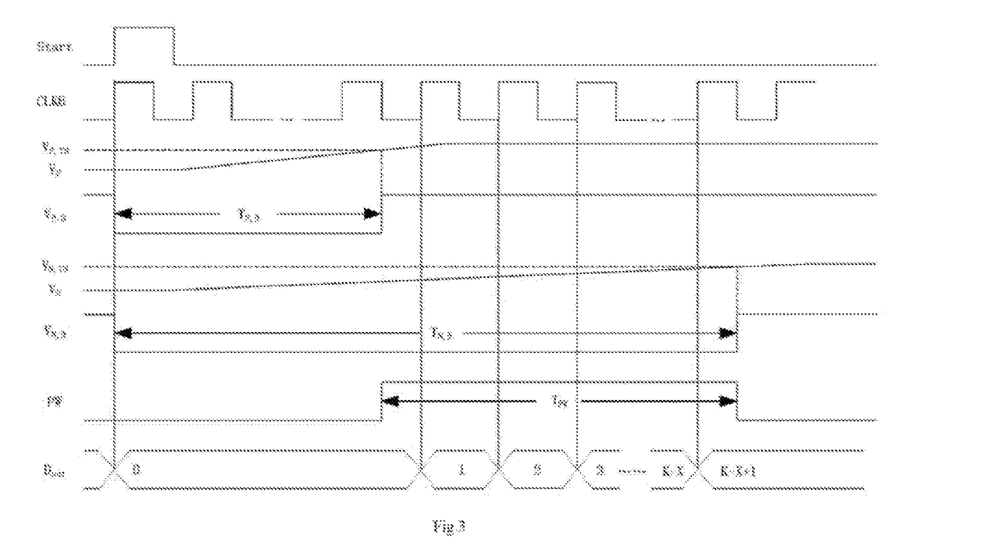
FIG. 3 shows a working principle diagram II of a temperature sensor in the existing art.

However, the system clock CLK of the temperature sensor disclosed by the patent entitled Low-Voltage and Low-Power CMOS temperature Sensor with application NO. CN102338669A directly adopts the clock recovered by the radio-frequency front end of the RFID tag from the field energy sent by a card reader, and therefore the output value of the temperature sensor is directly related to the carrier frequency received by the RFID tag. At present, the carrier frequency of the card reader is not strictly stipulated in the RFID industry standard, and therefore even the carrier frequency sent by the card readers produced in different batches of different manufacturers has considerably large difference, so as to lead to considerably large difference in the cycle of the system clock CLK recovered by the temperature sensor. And therefore even though the pulse width TPW is same (the temperature is same), when a system clock CLKA recovered by a card reader A is used, the counting result of the temperature sensor is K CLKA cycle(s), as shown in FIG. 2; while when a system clock CLKB recovered by a card reader B is used, the counting result of the temperature sensor is K-X CLKA cycle(s) (X is a natural number), as shown in FIG. 3. Above all, although the same temperature is measured by the same temperature sensor, different temperature readings can be read by different card readers, the temperature value is an absolute quantity; apparently, the temperature sensor has very poor precision and poor consistency and is not practical.

The above describes the problem that the precision and the consistency of the temperature sensor is compromised due to the cycle deviation of the clock signals input by different temperature sensors or in different application occasions. However, for the same temperature sensor, the cycle of the clock signal also possibly changes during one-time temperature measurement, as the cycle of the clock signal can change with the time fluctuation due to the factors of application systems, circuit noise, manufacturing process, and so on. For example, in the field of RFID, the fluctuation of the carrier frequency of the card reader causes the fluctuation of the frequency of the clock signal recovered by the passive RFID tag from the energy field, and the fluctuation of the frequency of the clock signal, i.e. the fluctuation of the cycle, is possibly generated during one-time measurement. Similar to the above situations, during the measurement of the temperature sensor, the variation of the cycle of the clock signal can also affect the measurement precision and the consistency of the time domain integrated temperature sensor.

SUMMARY

The cycle of the clock signal of the time domain integrated temperature sensor in the existing art is easily affected by the application system, the circuit parameters, the working conditions and the manufacturing technique to cause considerably large difference. In order to solve the problem that the reading of the existing time domain integrated temperature sensor is inconsistent along with the change of the cycle of the clock signal, the present invention provides a time domain integrated temperature sensor, and the temperature reading obtained through measurement is unrelated to the cycle of the clock signal, so as to ensure the reading consistency of the time domain integrated temperature sensor applied in an occasion that the frequency of the clock signal significantly changes (for example, a time domain temperature sensor integrated in a passive RFID tag) and improve the precision of the time domain temperature sensor to a certain degree.

In order to solve the above problem, the present invention adopts the technical solution as follows: the time domain integrated temperature sensor comprises a PTAT time delay circuit, a CTAT time delay circuit, an XOR gate and a counter, wherein two input ends of the XOR gate are respectively connected to an output end of the PTAT time delay circuit and an output end of the CTAT time delay circuit, an output end of the XOR gate is connected with an enable end of the counter, and a clock signal input end of the counter is connected to a clock input port of the temperature sensor;

the PTAT time delay circuit comprises a PTAT current generation circuit, a first capacitor, a first switch and a first level-detection circuit, an output end of the PTAT current generation circuit is connected to a positive end of the first capacitor, the first switch and an input end of the first level-detection circuit, the first capacitor and the first switch are connected with each other in parallel and then connected to the ground, and an output end of the first level-detection circuit is connected to a first input end of the XOR gate;

the CTAT time delay circuit comprises a CTAT current generation circuit, a second capacitor, a second switch and a second level-detection circuit, an output end of the CTAT current generation circuit is connected to a positive end of the second capacitor and the second switch, an input end of the second level-detection circuit, the second capacitor and the second switch are connected with each other in parallel and then connected to ground, and an input end of the second level-detection circuit is connected to a second input end of the XOR gate;

the output end of the PTAT current generation circuit is connected with a first switch unit, an output end of the first switch unit is connected to the positive end of the first capacitor, and a control end of the first switch unit is connected to the clock input port of the temperature sensor through a pulse shaping circuit;

the output end of the CTAT current generation circuit is connected with a second switch unit, an output end of the second switch unit is connected to the positive end of the second capacitor, and a control end of the second switch unit is connected to the clock input port of the temperature sensor through the pulse shaping circuit;

an input end of the pulse shaping circuit is connected to the clock input port of the temperature sensor, an output end of the pulse shaping circuit is connected to the control end of the first switch unit and the control end of the second switch unit respectively, the clock signal input end of the counter is used for shaping an input clock signal into a square wave signal with the same cycle with the input clock signal, the time of high voltage-level of the square wave signal within the cycle is a constant time, the square wave signal is used for controlling switching on and off of the first switch unit and the second switch unit, the square wave signal is also taken as a clock of the counter to count during high voltage-level of a pulse signal, and the counting result is a quantization result of the pulse width of the pulse signal.

Further, the first switch unit is a third switch or a first compound switch, and the second switch unit is a fourth switch or a second compound switch.

The time domain integrated temperature sensor of the present invention adopts the pulse shaping circuit to shape the input clock signal, the shaped square wave signal and the input clock signal have the same cycle, and the high voltage-level time of the positive semi-cycle in the cycle of the square wave signal is a constant time stipulated by the shaping circuit. The charging time of the capacitors is controlled through the shaped square wave signal, namely, the capacitors are charged during high voltage-level of the square wave signal and are not charged during low voltage-level of the square wave signal. The square wave signals shaped by different cycles of clock signals have strictly the same charging time and different charging stop time, and therefore the capacitors are charged in the manner, the time required by the positive ends of the capacitors for reaching overturn thresholds of the level-detection circuits is related to the cycle of the input clock, and the time delay of the rising edges of voltage signals (hereinafter referred to as time delay signals) output by the level-detection circuits is related to the cycle of the input clock. The pulse signal related to pulse width, temperature and the cycle of the input clock is generated through logical XOR operation on the time delay signal generated when the capacitors are charged by one way of PTAT current in an above control manner and the time delay signal generated when the capacitors are charged by one way of CTAT current in the same manner; then, the same input clock signal is adopted for quantifying the pulse width of the pulse signal, the relevance of the obtained quantization result and the cycle of the input clock is completely cancelled, namely, the output value of the temperature sensor is unrelated to the cycle of the input clock signal, thereby solving the problem that the reading of the existing time domain integrated temperature sensor is inconsistent as the cycle of the clock signal changes and improving the precision of the time domain integrated temperature sensor to a certain degree.

BRIEF DESCRIPTION OF DRAWINGS

In order to illustrate the technical solutions in the embodiments of the present invention or in the existing art more clearly, drawings to be used in description of the embodiments are introduced simply; apparently, the drawings in the following description are only some embodiments of the present invention, and those ordinary skilled in the art may acquire other drawings according to the following drawings on the premise of without contributing any creative effort.

DETAILED DESCRIPTION

The technical solutions in the embodiments of the present invention will be described clearly and completely below in combination with drawings in the embodiments of the present invention. Apparently, the described embodiments are merely a part of embodiments of the present invention but not all of the embodiments. Based on the embodiments of the present invention, all other embodiments acquired by those ordinary skilled in the art on the premise of without contributing any creative effort belong to the protection scope of the present invention.

Figure 4:
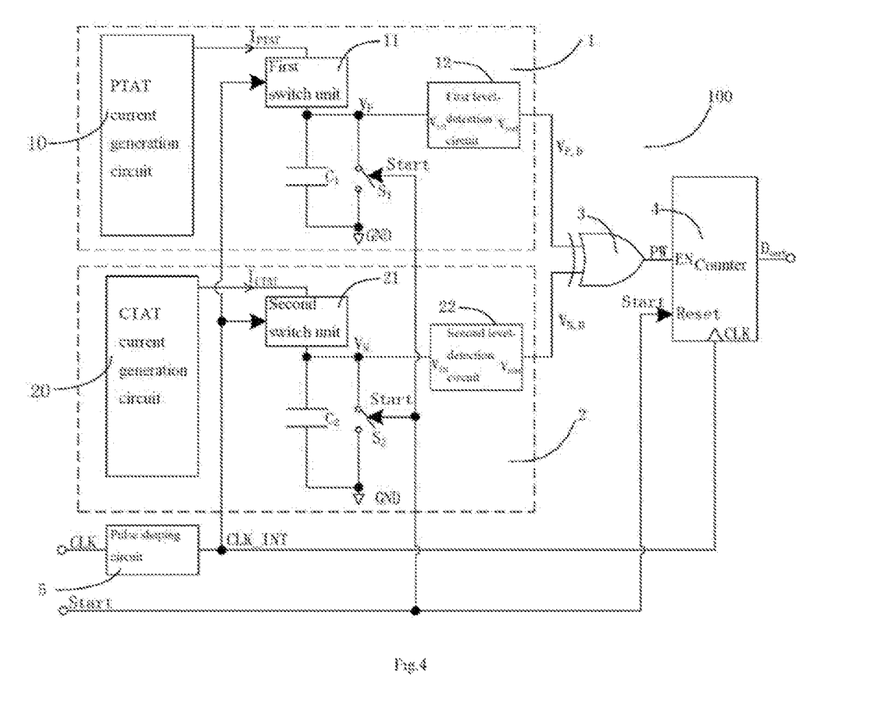
FIG. 4 shows a structure diagram of a temperature sensor circuit of the present invention.

FIG. 4 shows a structure diagram of a temperature sensor circuit of the present invention, the temperature sensor circuit 100 comprises the PTAT time delay circuit 1, the CTAT time delay circuit 2, the XOR gate 3 and the counter 4, wherein the two input ends of the XOR gate 3 are respectively connected to the output end of the PTAT time delay circuit 1 and the output end of the CTAT time delay circuit 2, the output end of the XOR gate 3 is connected with the enable end EN of the counter 4, and after XOR processing on the time delay signal in direct proportion with temperature generated by the PTAT time delay circuit 1 and the time delay signal in inverse proportion with temperature generated by the CTAT time delay circuit 2, the obtained pulse signal PW with pulse width changing with temperature is input into the counter 4. The clock signal input end of the counter 4 is connected to the clock input port CLK of the temperature sensor, so that the counter 4 can quantify the pulse signal PW with pulse width changing with temperature through the clock signal CLK, so as to obtain a quantified temperature signal $D_{out}$, and the quantified temperature signal $D_{OUT}$ is output.

As shown in FIG. 4, the PTAT time delay circuit 1 comprises the PTAT current generation circuit 10, the first capacitor $C_1$, the first switch $S_1$ and the first level-detection circuit 12. The PTAT current generation circuit 10 is used for generating charging current $I_{PTAT}$ in direct proportion with temperature, the output end of the PTAT current generation circuit 10 is connected to the positive end of the first capacitor $C_1$ the first switch $S_1$ and the input end $V_{in}$ of the first level-detection circuit 12, the first capacitor $C_1$ and the first switch $S_1$ are connected with each other in parallel and then connected to the ground, and the output end $V_{out}$ of the first level-detection circuit 12 is connected to the first input end of the XOR gate 3.

In order to ensure the zero charge quantity of the first capacitor $C_1$ when the charging current $I_{PTAT}$ starts to charge the first capacitor $C_1$ and to ensure the counting precision of the counter 4, as shown in FIG. 4, a Start signal input port is connected with the first switch $S_1$ and used for controlling the first switch $S_1$ to be closed before the first capacitor $C_1$ starts to be charged, the Start signal input port, the first switch $S_1$ and the first capacitor $C_1$ form a loop to dissipate the charge on the first capacitor $C_1$ to ground, so that the voltage VP of the positive end of the first capacitor $C_1$ is zero. In addition, the Start signal input port is also connected with a reset end Reset of the counter 4, so that the counter 4 can reset when starting to work. When the charging current $I_{PTAT}$ starts to charge the first capacitor $C_1$, a Start signal is used for controlling the first switch $S_1$ to be disconnected, the charging current IPTAT is used for charging the first capacitor $C_1$, so that the voltage $V_P$ of the positive end of the first capacitor $C_1$ increases gradually, when the voltage $V_P$ increases to over the threshold voltage $V_{P,TH}$ of the first level-detection circuit 12, the first level-detection circuit 12 is overturned, the voltage $V_{P,TH}$ output by the output end $V_{out}$ of the first level-detection circuit 12 is overturned from a low voltage-level signal to a high voltage-level signal.

The output end of the PTAT current generation circuit is also connected with the first switch unit 11, the input end of the first switch unit 11 is connected with the output end of the PTAT current generation circuit 10, the control end of the first switch unit 11 is connected to the clock input port of the temperature sensor through the pulse shaping circuit 5, and the output end of the first switch unit 11 is connected to the positive end of the first capacitor $C_1$. The first switch unit 11 is used for controlling the charging current $I_{PTAT}$ to charge the first capacitor $C_1$ discontinuously according to the clock cycle of the clock signal, so as to generate the time delay signal related to temperature, so that the time delay of the time delay signal is related to the clock frequency.

The CTAT time delay circuit comprises the CTAT current generation circuit 20, the second capacitor $C_2$, the second switch $S_2$ and the second level-detection circuit 22. The CTAT current generation circuit 20 is used for generating charging current $I_{CTAT}$ in inverse proportion with temperature, the output end of the CTAT current generation circuit 20 is connected to the positive end of the second capacitor $C_2$, the second switch $S_2$ and the input end $V_{in}$ of the second level-detection circuit 22, the second capacitor $C_2$ and the second switch $S_2$ are connected with each other in parallel and then connected to ground, and the input end $V_{out}$ of the second level-detection circuit 22 is connected to the second input end of the XOR gate 3.

In order to ensure the zero charge quantity of the second capacitor C2 when the charging current $I_{CTAT}$ starts to charge the second capacitor $C_2$ and to ensure the counting precision of the counter 4, as shown in FIG. 4, the Start signal input port is connected with the second switch $S_2$ and used for controlling the second switch $S_2$ to be closed before the second capacitor $C_2$ starts to be charged, the Start signal input port, the second switch $S_2$ and the second capacitor $C_2$ form a loop to dissipate the charge on the second capacitor $C_2$ to ground, so that the voltage $V_N$ of the positive end of the second capacitor $C_2$ is zero. When the charging current $I_{CTAT}$ starts to charge the second capacitor $C_2$, a Start signal is used for controlling the second switch $S_2$ to be disconnected, the charging current $I_{CTAT}$ is used for charging the second capacitor $C_2$, so that the voltage $V_N$ of the positive end of the second capacitor $C_2$ increases gradually, when the voltage $V_N$ increases to over the threshold voltage $V_{N,TH}$ of the second level-detection circuit 22, the second level-detection circuit 22 is overturned, the voltage $V_{N,D}$ output by the output end $V_{out}$ of the second level-detection circuit 22 is overturned from a low voltage-level signal to a high voltage-level signal.

The output end of the CTAT current generation circuit is also connected with the second switch unit 12, the input end of the second switch unit 12 is connected with the output end of the CTAT current generation circuit 20, the control end of the second switch unit 12 is connected to the clock input port of the temperature sensor through the pulse shaping circuit 5, and the output end of the second switch unit 12 is connected to the positive end of the second capacitor $C_2$. The second switch unit 12 is used for controlling the charging current $I_{CTAT}$ to charge the second capacitor $C_2$ discontinuously according to the clock cycle of the clock signal, so as to generate the time delay signal related to temperature, so that the time delay of the time delay signal is related to the clock frequency.

Figure 12:
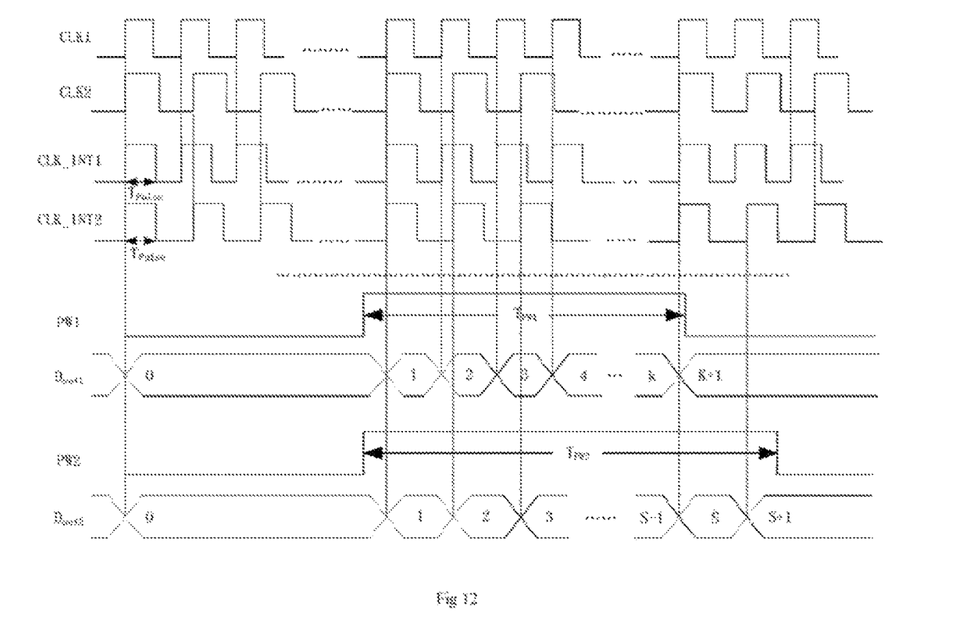
FIG. 12 shows a comparison diagram of working sequence diagrams of two different frequencies of clock signals adopted by a temperature sensor.

The frequencies of the clock signals CLK adopted among different temperature sensors differ from one another, such as the CLK1 and the CLK2 shown in FIG. 12, and therefore different frequencies of the clock signals CLK can cause the inconsistency of the temperature readings in different temperature sensors. In order to solve the problem, the first switch unit 11 and the second switch unit 21 are added in the present invention, the pulse shaping circuit 5 is connected between the control end of the first switch unit 11 and the clock signal CLK and the control end of the second switch unit 21 and the clock signal CLK, the input end of the pulse shaping circuit 5 is connected to the clock input port of the temperature sensor, the output end of the pulse shaping circuit 5 is connected to the control end of the first switch unit 11, the control end of the second switch unit 21 and the clock signal input end of the counter 4 and used for shaping the input clock signal CLK into the square wave CLK_INT with the same cycle with the input clock signal, the time of high voltage-level of the square wave signal within the cycle is a constant time, the square wave signal CLK_INT is used for controlling switching on and off of the first switch unit 11 and the second switch unit 21, the square wave signal CLK_INT is also taken as the clock of the counter 4 to quantify the pulse width of the pulse signal related to temperature. As shown in FIG. 12, after the two different frequencies of input clock signals CLK1 and CLK2 are shaped by the pulse shaping circuit 5, the cycles of the corresponding output square wave signals CLK_INT1 and CLK_INT2 are respectively the same with the cycles of the input clock signals CLK1 and CLK2, but the time of high voltage-level of the square wave signal CLK_INT1 and the time of high voltage-level of the square wave signal CLK_INT2 are the constant as $T_{PULSE}$ and cannot change with the cycle of the input clock signal.

Figure 5:
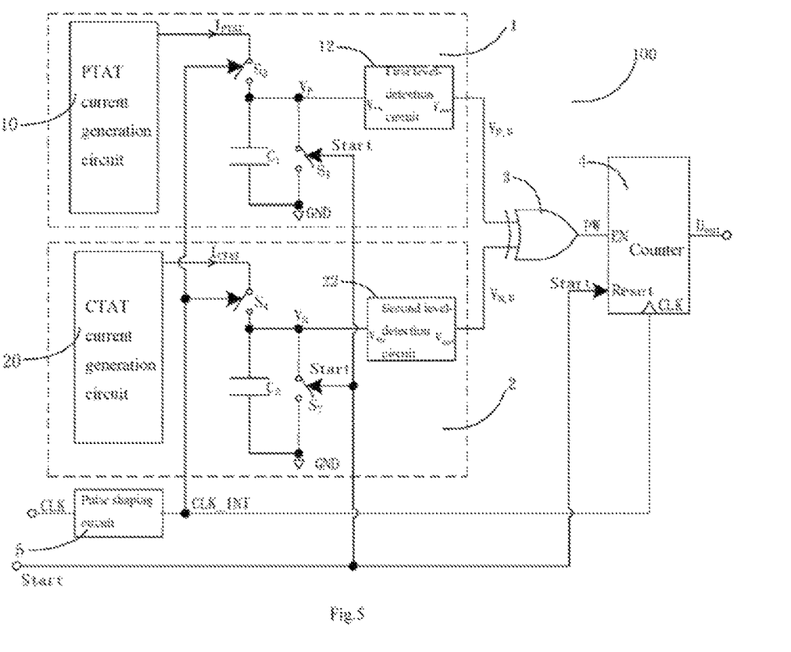
FIG. 5 shows a structure diagram of an embodiment I of a temperature sensor circuit of the present invention.

FIG. 5 shows a structure diagram of an embodiment I of a temperature sensor circuit of the present invention, in the embodiment, the first switch unit 11 is the third switch $S_3$, and the second switch unit 12 is the fourth switch $S_4$. As shown in the figure, the input end of the third switch $S_3$ is connected to the output end of the PTAT current generation circuit 10, the control end of the third switch $S_3$ is connected to the output end of the pulse shaping circuit 5, and the output end of the third switch $S_3$ is connected to the positive end of the first capacitor $C_1$; the input end of the fourth switch $S_4$ is connected to the output end of the CTAT current generation circuit 20, the control end of the fourth switch $S_4$ is connected to the output end of the pulse shaping circuit 5, and the output end of the fourth switch $S_4$ is connected to the positive end of the second capacitor $C_2$.

The control end of the third switch $S_3$ and the control end of the fourth switch $S_4$ are used for receiving control from the square wave signal CLK_INT output by the pulse shaping circuit 5, so when the square wave signal CLK_INT output by the pulse shaping circuit 5 is at high voltage-level, the third switch $S_3$ and the fourth switch $S_4$ are switched off, and the current $I_{PTAT}$ and the current $I_{CTAT}$ start to charge the first capacitor $C_1$ and the second capacitor $C_2$ respectively. When the square wave signal CLK_INT output by the pulse shaping circuit 5 is at low voltage-level, the third switch $S_3$ and the fourth switch $S_4$ are switched off, the first capacitor $C_1$ and the second capacitor $C_2$ stop charging, then charging continues when the square wave signal CLK_INT is at high voltage-level, the same process is repeated, until the voltage $V_P$ of the two ends of the first capacitor $C_1$ and the voltage $V_N$ of the two ends of the second capacitor $C_2$ respectively reach the threshold voltage $V_{P,TH}$ of the first level-detection circuit 12 and the threshold voltage $V_{N,TH}$ of the second level-detection circuit 22, the output signals of the first level-detection circuit 12 and the second level-detection circuit 22 are overturned, and therefore the time delay of the time delay signals formed by charging of the first capacitor $C_1$ and the second capacitor $C_2$ is in positive correlation to the cycle of the input clock, and the time delay signals can generate the pulse width in positive correlation to the cycle of the input clock signal.

Figure 6:
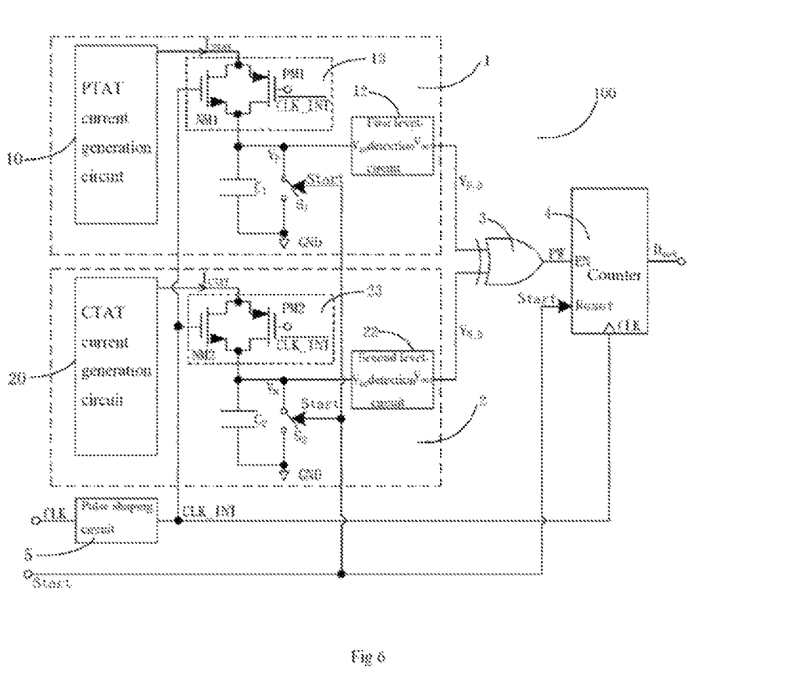
FIG. 6 shows a structure diagram of an embodiment II of a temperature sensor circuit of the present invention.

FIG. 6 shows a structure diagram of an embodiment II of a temperature sensor circuit of the present invention, in the embodiment, the first switch unit 11 is the first compound switch 13, the first compound switch 11 comprises a first N-type MOS (Metal Oxide Semiconductor) transistor NM1 and a first P-type MOS transistor PM1 that are connected with each other in parallel, a drain electrode of the first N-type MOS NM1 transistor is connected to a source electrode of the first P-type MOS transistor PM1 and then is connected to the output end of the PTAT current generation circuit 10, a source electrode of the first N-type MOS transistor NM1 is connected to a drain electrode of the first P-type MOS transistor PM1 and then is connected to the positive end of the first capacitor $C_1$, a grid electrode of the first N-type MOS transistor NM1 is connected to the output end of the pulse shaping circuit 5, and a grid electrode of the first P-type MOS transistor PM1 is connected to the output end of the pulse shaping circuit 5 through a phase inverter, the second switch unit 12 is a second compound switch 23, the second compound switch 23 comprises a second N-type MOS transistor NM2 and a second P-type MOS transistor PM2 that are connected with each other in parallel, a drain electrode of the second N-type MOS transistor NM2 is connected to a source electrode of the second P-type MOS transistor PM2 and then is connected to the output end of the CTAT current generation circuit 20, a source electrode of the second N-type MOS transistor NM2 is connected to a drain electrode of the second P-type MOS transistor PM2 and then is connected to the positive end of the second capacitor $C_2$, a grid electrode of the second N-type MOS transistor NM2 is connected to the output end of the pulse shaping circuit 5, and a grid electrode of the second P-type MOS transistor PM2 is connected to the output end of the pulse shaping circuit 5 through the phase inverter.

The gird electrode of the first N-type MOS transistor NM1 and the control end of the first P-type MOS transistor PM1 are used for receiving control from the square wave signal CLK_INT output by the pulse shaping circuit 5, so when the square wave signal CLK_INT output by the pulse shaping circuit 5 is at high voltage-level, the first N-type MOS transistor NM1 and the first P-type MOS transistor PM1 are conducted at the same time, and the current $I_{PTAT}$ starts to charge the first capacitor $C_1$; simultaneously, the second N-type MOS transistor NM2 and the second P-type MOS transistor PM2 are conducted at the same time, and the current $I_{CTAT}$ starts to charge the second capacitor $C_2$. When the square wave signal CLK_INT output by the pulse shaping circuit 5 is at low voltage-level, the third switch $S_3$ and the fourth switch $S_4$ are switched off, the first capacitor $C_1$ and the second capacitor $C_2$ stop charging, then charging continues when the square wave signal CLK_INT is at high voltage-level, the same process is repeated, until the voltage $V_P$ of the two ends of the first capacitor $C_1$ and the voltage $V_N$ of the two ends of the second capacitor $C_2$ respectively reach the threshold voltage $V_{N,TH}$ of the first level-detection circuit 12 and the threshold voltage $V_{N,TH}$ of the second level-detection circuit 22, the output signals of the first level-detection circuit 12 and the second level-detection circuit 22 are overturned, and therefore the time delay signals in positive correlation to the cycle of the input clock signal are formed by the first capacitor $C_1$ and the second capacitor $C_2$.

The first switch unit 11 and the second switch unit 21 of the present invention can be in a symmetrical structure and also be in an asymmetrical structure, namely, the first switch unit and the second switch unit can be any of the following four combinations: the first switch unit 11 is the third switch $S_3$, and the second switch unit 21 is the fourth switch $S_4$; the first switch unit 11 is the third switch $S_3$, and the second switch unit 21 is the second compound switch 23; the first switch unit 11 is the first compound switch 13, and the second switch unit 21 is the fourth switch $S_4$; the first switch unit 11 is the first compound switch 13, and the second switch unit 21 is the second compound switch 23.

Figure 7:
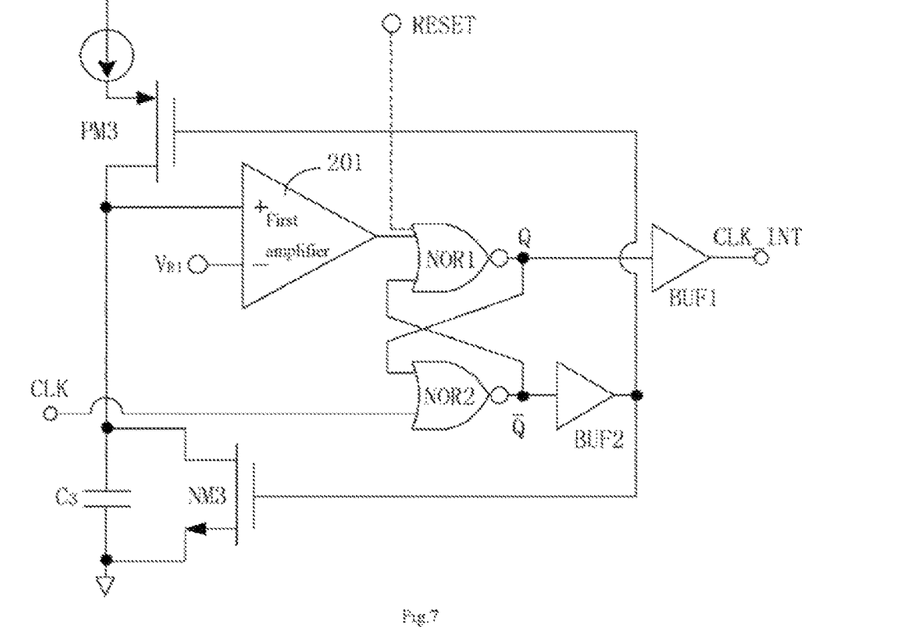
FIG. 7 shows a structure diagram of an embodiment I of a pulse shaping circuit of the present invention.

FIG. 7 shows a structure diagram of an embodiment I of a pulse shaping circuit of the present invention 5. The pulse shaping circuit comprises a current source, a third P-type MOS transistor PM3, a first amplifier 201, a first NOR (Nor OR) gate NOR1, a second NOR gate NOR2, a first buffer BUF1, a second buffer BUF2, a third capacitor C3 and a third N-type MOS transistor NM3, an output end of the current source is connected to a source electrode of the third P-type MOS transistor PM3, a drain electrode of the third P-type MOS transistor PM3 is connected to ground through the third capacitor $C_3$, a positive input end of the first amplifier is connected to a drain electrode of the third P-type MOS transistor PM3, a negative input end of the first amplifier is connected to a first reference voltage end $V_{R1}$, an output end of the first amplifier is connected to a second input end of the first NOR gate NOR1, a first input end of the first NOR gate NOR1 is connected to a reset signal end RESET, a third input end of the first NOR gate NOR1 is connected to an output end of the second NOR gate NOR2, the output end of the first NOR gate NOR 1 is connected to the first input end of the second NOR gate NOR 2 and an input end of the first buffer BUF1, an output end of the first buffer BUF1 is taken as the output end of the pulse shaping circuit, a second input end of the second NOR gate NOR2 is connected to the clock signal CLK as the input end of the pulse shaping circuit, an output end of the second NOR gate NOR2 is connected to a grid electrode of the third P-type MOS transistor PM3 and a grid electrode of the third N-type MOS transistor NM3 through the second buffer BUF2, a drain electrode of the third N-type MOS transistor NM3 is connected to a drain electrode of the third P-type MOS transistor PM3, and a source electrode of the third N-type MOS transistor NM3 is connected to ground.

Figure 8:
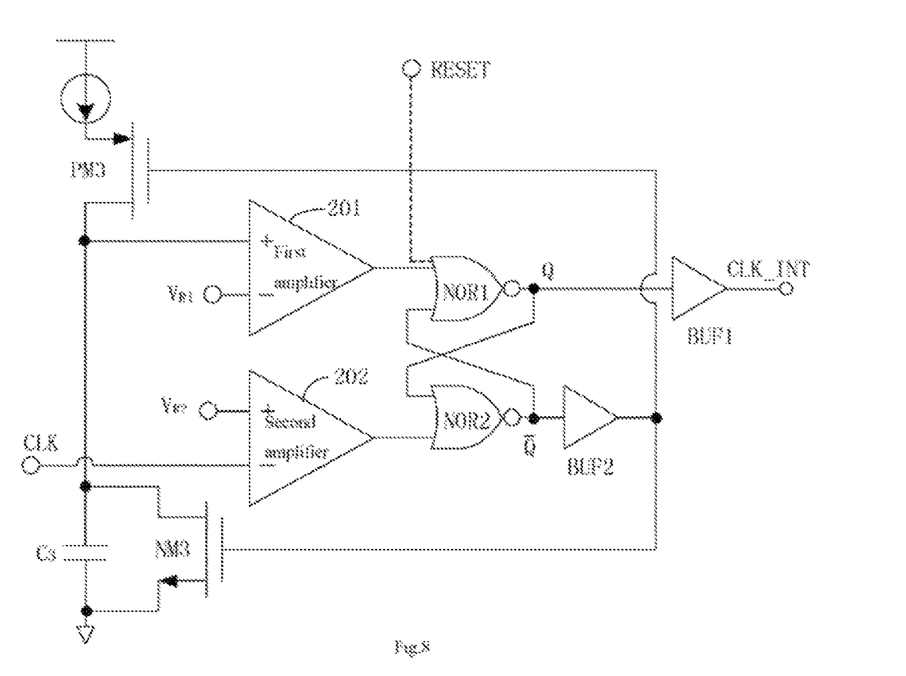
FIG. 8 shows a structure diagram of an embodiment II of a pulse shaping circuit of the present invention.

FIG. 8 is a structure diagram of an embodiment II of a pulse shaping circuit of the present invention; the differences between the embodiment II and the embodiment I are that a second input end of the second NOR gate NOR2 is connected to an output end of a second amplifier 202, a positive input end of the second amplifier 202 is connected to a second reference voltage end $V_{R2}$, and a negative input end of the second amplifier 202 is connected to the clock signal CLK as the input end of the pulse shaping circuit.

The pulse shaping circuit 5 is used for shaping the input clock signal CLK into the square wave signal CLK_INT with the same cycle with the input clock signal, the time of high voltage-level of the square wave signal within the cycle is a constant time, in order to ensure that the time lengths of high voltage-levels within the cycles are constant after different frequencies of clock signals are shaped by the pulse shaping circuit 5, it needs to ensure that the third capacitor $C_3$ in the pulse shaping circuit 5 has the strictly constant capacity. For overcoming the defect of capacity inconsistency caused by the factors of process deviation and the like, the third capacitor $C_3$ adopted by the pulse shaping circuit 5 of the present invention can adopt calibration technologies of laser trimming and the like or adopt an external capacitor with higher precision.

Figure 9:
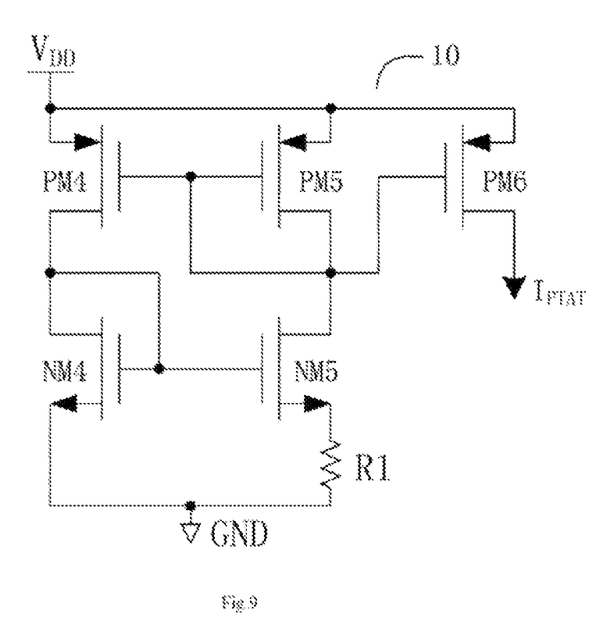
FIG. 9 shows a structure diagram of a PTAT current generation circuit of the present invention.

FIG. 9 shows a structure diagram of a PTAT current generation circuit 10 of the present invention. As shown in the figure, the PTAT current generation circuit 10 comprises a fourth P-type MOS transistor PM4, a fifth P-type MOS transistor PM5, a sixth P-type MOS transistor PM6, a fourth N-type MOS transistor NM4, the fifth N-type MOS transistor NM5 and a first resistor R1.

Source electrodes of the fourth P-type MOS transistor PM4, the fifth P-type MOS transistor PM5 and the sixth P-type MOS transistor PM6 are connected to a power supply $V_{DD}$, and grid electrodes of the fourth P-type MOS transistor PM4, the fifth P-type MOS transistor PM5 and the sixth P-type MOS transistor PM6 are respectively connected with each other to form a current mirror. A drain electrode of the fourth P-type MOS transistor PM4 is connected with a drain electrode of the fourth N-type MOS transistor NM4, the drain electrode and a grid electrode of the fourth N-type MOS transistor NM4 are connected with each other, and a source electrode of the fourth N-type MOS transistor NM4 is connected to ground; a drain electrode and the grid electrode of the fifth P-type MOS transistor PM5 are connected with each other and then are simultaneously connected with a drain electrode of the fifth N-type MOS transistor NM5, a grid electrode of the fifth N-type MOS transistor NM5 is connected with the grid electrode of the fourth N-type MOS transistor NM4, a source electrode of the fifth N-type MOS transistor NM5 is connected with one end of the first resistor R1, and the other end of the first resistor R1 is connected to ground; the source electrode of the sixth P-type MOS transistor PM6 is connected to the power supply $V_{DD}$, and a drain electrode of the sixth P-type MOS transistor PM6 is taken as the output current $I_{PTAT}$ of the output end of the PTAT current generation circuit 10.

Figure 10:
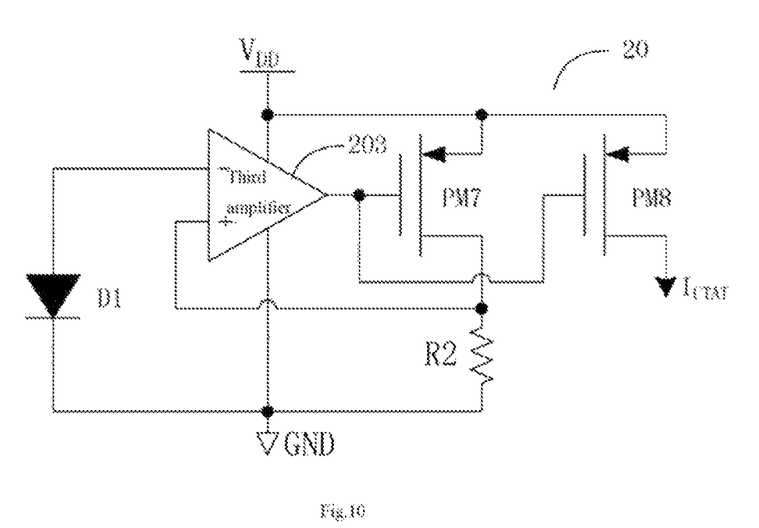
FIG. 10 shows a structure diagram of a CTAT current generation circuit of the present invention.

FIG. 10 shows a structure diagram of a CTAT current generation circuit 20 of the present invention. As shown in FIG. 10, the CTAT current generation circuit 20 comprises a seventh P-type MOS transistor PM7, an eighth P-type MOS transistor PM8, a third amplifier 203, a second resistor R2 and a diode D1.

A positive power supply end of the third amplifier 203, a source electrode of the seventh P-type MOS transistor PM7 and a source electrode of the eighth P-type MOS transistor PM8 are commonly connected to the power supply $V_{DD}$; a negative input end of the third amplifier 203 is connected with a positive electrode of the diode D1, and a negative electrode of the diode D1 is connected to ground; a positive input end of the third amplifier 203 is connected with a drain electrode of the seventh P-type MOS transistor PM7; a negative power supply end of the third amplifier 203 is directly connected to ground; a drain electrode of the seventh P-type MOS transistor PM7 is connected with one end of the second resistor R2, and the other end of the second resistor R2 is connected to ground; an output end of the third amplifier 203 is connected to a grid electrode of the seventh P-type MOS transistor PM7, a grid electrode of the eighth P-type MOS transistor PM8 is connected to the grid electrode of the seventh P-type MOS transistor PM7, the eighth P-type MOS transistor PM8 and the seventh P-type MOS transistor PM7 form a current mirror, and a drain electrode of the eighth P-type MOS transistor PM8 is taken as the output end of the CTAT current generation circuit 20 to output current $I_{CTAT}$.

In the present invention, the first level-detection circuit 12 in the PTAT time delay circuit 1 and the second level-detection circuit 22 in the CTAT time delay circuit 2 have the same structure, and the structure of the level-detection circuit is described in details below through combination with FIG. 11.

Figure 11:
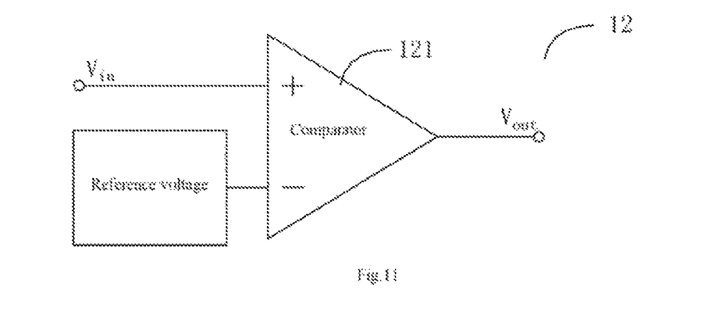
FIG. 11 shows a structure diagram of a level-detection circuit.

As shown in FIG. 11, the level-detection circuit 12 comprises a comparator 121.

A positive input end of the comparator 121 is taken as the input end $V_{in}$ of the level-detection circuit 12, a negative input end of the comparator 121 is connected to the reference voltage end, and an output end of the comparator 121 is taken as the output end $V_{out}$ of the level-detection circuit 12.

FIG. 12 shows a comparison diagram of working sequence diagrams of two different frequencies of clock signals adopted by a temperature sensor circuit 100, and in order to show clearly, the relevant parts of the clock signals are only shown in the figure. As shown in the figure, after the first clock signal CLK1 is shaped by the pulse shaping circuit, the first square wave signal CLK_INT1 is output, the time length of high voltage-level within each cycle of the first square wave signal CLK_INT1 is constant as $T_{pulse}$, and the frequency within each cycle of the first square wave signal CLK_INT1 is the same with that of the first clock signal CLK1. The first square wave signal CLK_INT1 is used for controlling the charging time of the first capacitor and the second capacitor; when the first square wave signal CLK_INT1 is at high voltage-level, the first capacitor and the second capacitor are charged; and when the first square wave signal CLK_INT1 is at low voltage-level, the first capacitor and the second capacitor stop to be charged. As the time of high voltage-level of the first square wave signal CLK_INT1 is constant as $T_{pulse}$, it assumes that the effective charging time of the first capacitor is $T_{pulse}*n$ and the effective charging time of the second capacitor is $T_{pulse}*m$ (m and n are natural numbers), the time delay formed by the first capacitor is $$T_{P,D} = n * T_{Pulse} * \frac{T_{CLK1}}{T_{Pulse}},$$

i.e., $T_{N,D}=m*T_{CLK1}$; similarly, the time delay formed by the second capacitor is $$T_{N,D} = m * T_{Pulse} * \frac{T_{CLK1}}{T_{Pulse}1},$$

i.e., $T_{N,D}=m*T_{CLK1}$; and therefore the pulse signal PW is obtained through OR operation, and the pulse width of pulse signal PW is $T_{PW1}=(m-n)*T_{CLK1}$. The counter adopts the first square wave signal CLK_INT1 to quantify the pulse width $T_{PW1}$ of the pulse signal PW, the quantization result is $$\frac{(m-n)*T_{CLK1}}{T_{CLK1}} = m - n * CLK1 \text{ cycle},$$

and therefore in FIG. 12, the counting result k should be equal to m−n.

According to the same principle, when the clock signal is CLK2, after the second clock signal CLK2 is shaped by the pulse shaping circuit, the second square wave signal CLK_INT2 is output, the time length of high voltage-level within each cycle of the second square wave signal is constant as $T_{pulse}$, and the frequency of high voltage-level with each cycle of the second square wave signal is the same with that of the second clock signal CLK2. The second square wave signal CLK_INT2 is used for controlling the charging time of the first capacitor and the second capacitor; when the second square wave signal CLK_INT2 is at high voltage-level, the first capacitor and the second capacitor are charged; and when the second square wave signal CLK_INT1 is at low voltage-level, the first capacitor and the second capacitor stop to be charged. As the time of high voltage-level of the second square wave signal CLK_INT2 is also constant as $T_{pulse}$, the effective charging time of the first capacitor is also $T_{Pulse}*n$, the effective charging time of the second capacitor is also $T_{Pulse}*m$, similarly to the situation of the first clock signal, the result that the pulse width $T_{PW2}=(m-n)*T_{CLK2}$ of the pulse signal PW is equal to $(m-n)*TCLK2$ can be deducted in a similar way. The counter adopts the second square wave signal CLK_INT2 to quantify the pulse width $T_{PW2}$, the quantization result is $$\frac{(m-n)*T_{CLK2}}{T_{CLK2}} = m - n * CLK2 \text{ cycle},$$

and therefore in FIG. 12, the counting result s should also be equal to m−n.

Based on the above analysis, although the first clock signal CLK1 and the second clock signal CLK2 have different frequencies, the temperature sensor of the present invention can output the same result m−n for two different frequencies of clock signals. Therefore, the temperature output valve $D_{out}$ of the temperature sensor 100 is not affected by the frequency of the clock signal, thereby solving the problem that the temperature value read by the existing time domain integrated temperature sensor is inconsistent along with the change of the cycle of the clock signal when the temperature signal is processed by the TDC and improving the reading precision of the time domain integrated temperature sensor to a certain degree.

Figure 13:
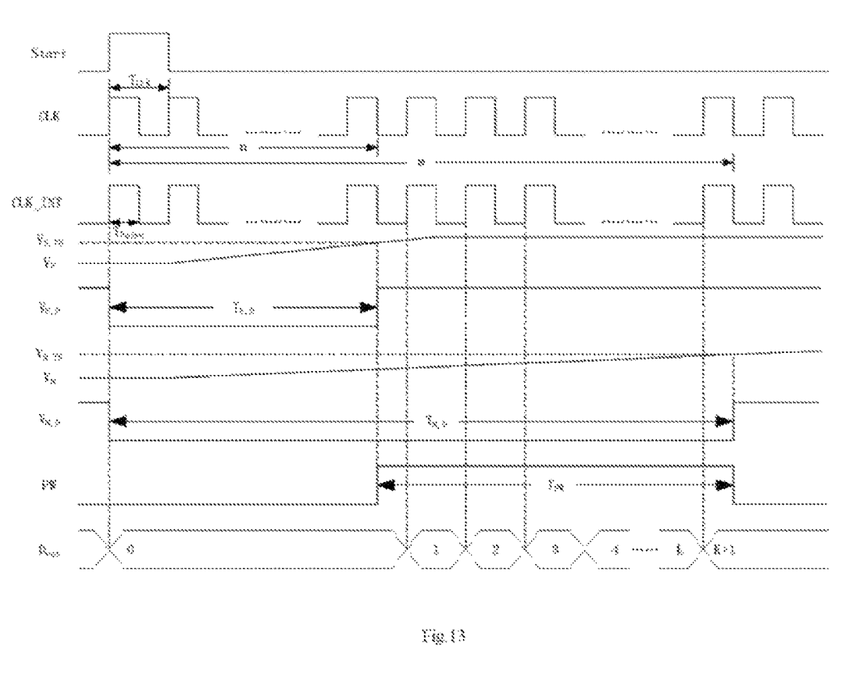
FIG. 13 shows a working sequence diagram of the embodiment of the present invention.

FIG. 13 shows a working sequence diagram of the embodiment of the temperature sensor circuit 100 of the present invention. As shown in the figure, the cycle of a reference clock is $T_{CLK}$, the cycle of the square wave signal output by the pulse shaping circuit 5 is the same with the cycle of the input clock signal, the time of high voltage-level with the cycle is $T_{PULSE}$, the time delay $T_{P,D}$ of the rising edge of the output signal $V_{P,D}$ of the first level-detection circuit 12 is $T_{P,D}$, i.e. n clock cycles, $T_{CLK}$, the time delay $T_{N,D}$ of the rising edge of the output signal $V_{N,D}$ of the second level-detection circuit 22 is $T_{N,D}$, i.e. m clock cycles $T_{CLK}$, and the pulse width of the pulse signal output by the XOR gate is $T_{PW}$.

The output voltage $V_{N,D}$ of the second level-detection circuit 22 is taken as an example, the time delay $T_{N,D}$ of the rising edge thereof is calculated by the processes as follows:

The voltage of two ends of the second capacitor C2 rises from 0 to $V_{N,TH}$, the charging charge quantity of the second capacitor $C_2$ is Q, and Q is obtained by the expression below:

$$Q = C_2 * V_{N,TH} \tag{1}$$

wherein $V_{N,TH}$ is the threshold voltage of the second level-detection circuit 22, namely, when the input voltage thereof is higher than $V_{N,TH}$, the output is high; and when the input voltage is lower than $V_{N,TH}$, the output is low.

On the other hand, during the period that the voltage of the two ends of the second capacitor $C_2$ rises from 0 to $V_{N,TH}$, the total charge quantity supplied by the charging current $I_{CTAT}$ should be equal to the charging charge quantity Q of the two ends of the second capacitor $C_2$, and Q can be obtained by the expression below:

$$Q = m * T_{pulse} * I_{CTAT} \tag{2}$$

$$T_{N,D} = m * T_{CLK} \tag{3}$$

Based on the above expressions (1), (2) and (3), the expression below is obtained:

$$T_{N,D} = \frac{C_2 * V_{N,TH}}{I_{CTAT} * T_{pulse}} * T_{CLK} \tag{4}$$

In a similar way, the charging charge quantity of the two ends of the first capacitor C1 can be obtained:

$$Q' = C_1 * V_{P,TH} \tag{5}$$

In addition, Q' can be obtained by the expression below:

$$Q' = n * T_{pulse} * I_{PTAT} \tag{6}$$

$$T_{P,D} = n * T_{CLK} \tag{7}$$

Based on the above expressions (5), (6) and (7), the expression below is obtained:

$$T_{P,D} = \frac{C_1 * V_{P,TH}}{I_{PTAT} * T_{pulse}} * T_{CLK} \tag{8}$$

wherein $V_{P,TH}$ is the threshold voltage of the first level-detection circuit 12, and the pulse width $T_{PW}$ of the pulse signal can be obtained by the expression below:

$$T_{PW} = T_{N,D} - T_{P,D} \tag{9}$$

The above expressions (4) and (8) are substituted into the expression (9), obtaining:

$$T_{PW} = \frac{T_{CLK}}{T_{pulse}} * \left( \frac{C_2 * V_{N,TH}}{I_{CTAT}} - \frac{C_1 * V_{P,TH}}{I_{PTAT}} \right) \quad (10)$$

The output of the counter of the temperature sensor is obtained:

$$D_{out} = \frac{T_{PW}}{T_{CLK}} = \frac{1}{T_{pulse}} * \left( \frac{C_2 * V_{N,TH}}{I_{CTAT}} - \frac{C_1 * V_{P,TH}}{I_{PTAT}} \right) \quad (11)$$

As seen from the above expression (11), the output $D_{OUT}$ of the counter of the temperature sensor circuit 100 is unrelated to the cycle $T_{CLK}$ of the clock signal, and therefore the temperature reading corresponding to the output $D_{OUT}$ of the counter is also unrelated to the cycle of the clock signal. Therefore, the temperature reading measured by the temperature sensor of the present invention is not affected by the change of the cycle of the clock signal, thereby ensuring the reading consistency of the temperature sensor under different clock signals and improving the measurement precision to a certain degree.

We claim:

1. A time domain integrated temperature sensor, comprising a PTAT (Proportional To Absolute Temperature) time delay circuit, a CTAT (Complementary To Absolute Temperature) time delay circuit, an XOR (Exclusive OR) gate, a counter and a pulse shaping circuit, wherein two input ends of the XOR gate are respectively connected to an output end of the PTAT time delay circuit and an output end of the CTAT time delay circuit, an output end of the XOR gate is connected with an enable end of the counter, and a clock signal input end of the counter is connected to an output end of the pulse shaping circuit, an input end of the pulse shaping circuit is connected to a clock input port of the temperature sensor;

the PTAT time delay circuit comprises a PTAT current generation circuit, a first switch unit, a first capacitor, a first switch and a first level-detection circuit, an output end of the PTAT current generation circuit is connected to the first switch unit, an output end of the first switch unit is connected to a positive end of the first capacitor, the first switch and an input end of the first level-detection circuit, a control end of the first switch unit is connected to the clock input port of the temperature sensor through the pulse shaping circuit, the first capacitor and the first switch are connected with each other in parallel and then connected to the ground, and an output end of the first level-detection circuit is connected to a first input end of the XOR gate;

the CTAT time delay circuit comprises a CTAT current generation circuit, a second switch unit, a second capacitor, a second switch and a second level-detection circuit, an output end of the CTAT current generation circuit is connected to the second switch unit, an output end of the second switch unit is connected to a positive end of the second capacitor and the second switch, an input end of the second level-detection circuit, and a control end of the second switch unit is connected to the clock input port of the temperature sensor through the pulse shaping circuit, the second capacitor and the second switch are connected with each other in parallel and then connected to ground, and an input end of the second level-detection circuit is connected to a second input end of the XOR gate;

an output end of the pulse shaping circuit is connected to the control end of the first switch unit and the control end of the second switch unit respectively; the pulse shaping circuit is configured to shape an input clock signal into a square wave signal with the same cycle with the input clock signal, the time of high voltage-level of the square wave signal within the cycle is a constant time, the square wave signal is used for controlling switching on and off of the first switch unit and the second switch unit, the square wave signal is also taken as a clock of the counter to count during high voltage-level of a pulse signal, and the counting result is a quantization result of the pulse width of the pulse signal;

wherein the pulse shaping circuit comprises a current source, a third P-type MOS transistor, a first amplifier, a first NOR (Nor OR) gate, a second NOR gate, a first buffer, a second buffer, a third capacitor and a third N-type MOS transistor;

an output end of the current source is connected to a source electrode of the third P-type MOS transistor, a drain electrode of the third P-type MOS transistor is connected to ground through the third capacitor, a positive input end of the first amplifier is connected to a drain electrode of the third P-type MOS transistor, a negative input end of the first amplifier is connected to a first reference voltage end, an output end of the first amplifier is connected to a second input end of the first NOR gate, a first input end of the first NOR gate is connected to a reset signal end, a third input end of the first NOR gate is connected to an output end of the second NOR gate, the output end of the first NOR gate is connected to the first input end of the second NOR gate and an input end of the first buffer, an output end of the first buffer is taken as the output end of the pulse shaping circuit, a second input end of the second NOR gate is connected to a clock signal end as the input end of the pulse shaping circuit, an output end of the second NOR gate is connected to a grid electrode of the third P-type MOS transistor and a grid electrode of the third N-type MOS transistor through the second buffer, a drain electrode of the third N-type MOS transistor is connected to a drain electrode of the third P-type MOS transistor, and a source electrode of the third N-type MOS transistor is connected to ground.

2. The time domain integrated temperature sensor according to claim 1, wherein the first switch unit is a third switch, an input end of the third switch is connected to the output end of the PTAT current generation circuit, a control end of the third switch is connected to the output end of the pulse shaping circuit, and an output end of the third switch is connected to the positive end of the first capacitor.

3. The time domain integrated temperature sensor according to claim 1, wherein the first switch unit is a first compound switch, the first compound switch comprises a first N-type MOS (Metal Oxide Semiconductor) transistor and a first P-type MOS transistor that are connected with each other in parallel, a drain electrode of the first N-type MOS transistor is connected to a source electrode of the first P-type MOS transistor and then is connected to the output end of the PTAT current generation circuit, a source electrode of the first N-type MOS transistor is connected to a drain electrode of the first P-type MOS transistor and then is connected to the positive end of the first capacitor, a grid electrode of the first N-type MOS transistor is connected to the output end of the pulse shaping circuit, and a grid electrode of the first P-type MOS transistor is connected to the output end of the pulse shaping circuit through a phase inverter.

4. The time domain integrated temperature sensor according to claim 1, wherein the second switch unit is a fourth switch, an input end of the fourth switch is connected to the output end of the CTAT current generation circuit, a control end of the fourth switch is connected to the output end of the pulse shaping circuit, and an output end of the fourth switch is connected to the positive end of the second capacitor.

5. The time domain integrated temperature sensor according to claim 1, wherein the second switch unit is a second compound switch, the second compound switch comprises a second N-type MOS transistor and a second P-type MOS transistor that are connected with each other in parallel, a drain electrode of the second N-type MOS transistor is connected to a source electrode of the second P-type MOS transistor and then is connected to the output end of the CTAT current generation circuit, a source electrode of the second N-type MOS transistor is connected to a drain electrode of the second P-type MOS transistor and then is connected to the positive end of the second capacitor, a grid electrode of the second N-type MOS transistor is connected to the output end of the pulse shaping circuit, and a grid electrode of the second P-type MOS transistor is connected to the output end of the pulse shaping circuit through the phase inverter.

* * * * *